(12) United States Patent
Ishii

(10) Patent No.: US 6,404,134 B2
(45) Date of Patent: Jun. 11, 2002

(54) PLASMA PROCESSING SYSTEM

(75) Inventor: Nobuo Ishii, Osaka (JP)

(73) Assignee: Tokyo Electron Limited, Tokyo-to (JP)

( * ) Notice: Subject to any disclaimer, the term of this patent is extended or adjusted under 35 U.S.C. 154(b) by 0 days.

(21) Appl. No.: 09/789,612

(22) Filed: Feb. 22, 2001

(30) Foreign Application Priority Data

Feb. 24, 2000 (JP) ........................................ 2000-48001

(51) Int. Cl.$^7$ ................................................ H01J 1/50
(52) U.S. Cl. ............................. 315/111.21; 315/111.41; 315/111.71
(58) Field of Search ....................... 315/111.21, 111.41, 315/111.51, 111.71; 219/121.21, 121.36

(56) References Cited

U.S. PATENT DOCUMENTS 5,770,922 A  *  6/1998  Gerrish et al. .......... 315/111.21

* cited by examiner

*Primary Examiner*—David Vu
(74) *Attorney, Agent, or Firm*—Finnegan, Henderson, Farabow, Garrett and Dunner LLP

(57) ABSTRACT

A plasma processing system includes a processing vessel for housing therein an object to be processed. In the upper portion of the processing vessel, a substantially disk-shaped electrode plate having a facing surface facing the object is provided. A radio-frequency wave supply unit supplies radio-frequency waves having a flattened waveform which forms substantially a sinusoidal wave whose crest and trough portions are substantially horizontally flattened. The radio-frequency waves supplied from the supply unit are propagated in diametrically opposite directions on the facing surface of the electrode to form standing waves. Similar to the supplied radio-frequency waves, the standing waves also have a waveform which forms substantially a sinusoidal wave whose crest and trough portions are substantially horizontally flattened.

4 Claims, 4 Drawing Sheets

Prior Art

PLASMA PROCESSING SYSTEM

BACKGROUND OF THE INVENTION

1. Field of the Invention

The present invention relates generally to a plasma processing system which is designed to produce plasma in a processing vessel by supplying radio-frequency waves to electrodes. More specifically, the invention relates to a plasma processing system wherein the waveform of radio-frequency waves supplied to electrodes is improved.

2. Description of the Related Background Art

FIG. 5A shows an example of a conventional plasma processing system. The plasma processing system shown in FIG. 5A has a processing vessel 1 for housing therein an object W to be processed (e.g., a semiconductor wafer or a flat panel display substrate). In the upper portion of the processing vessel 1, an electrode plate (top electrode) 2 having a facing surface 20 facing the object W is provided.

The plasma processing system also has a radio-frequency power supply 30 for supplying radio-frequency waves to the electrode plate 2. At the center of the top of the processing vessel 1, a feeding channel 4 having a coaxial structure for feeding radio-frequency waves to the electrode plate 2 from the radio-frequency power supply 30 is provided.

The plasma processing system also has a substantially cylindrical supporting table (bottom electrode) 12 provided on the bottom of the processing vessel 1. To the supporting table 12, an RF bias power supply 15 for applying a predetermined RF bias power is connected. In the bottom of the processing vessel 1 corresponding to the surrounding of the supporting table 12, an exhaust port 13 for evacuating the atmosphere of the processing vessel 1 is formed. At an appropriate position in the upper portion of the processing vessel 1, an introducing pipe 14 for introducing a process gas or the like is provided.

The plasma processing system is designed to produce the plasma of the process gas by radio-frequency waves, which are applied to the electrode plate 2, in the processing vessel 1 which is held at a predetermined degree of vacuum. Then, the plasma processing system is designed to carry out various plasma processes, such as deposition and etching processes, with respect to the object W on the supporting table 12.

In the above described plasma processing system, standing waves are formed by radio-frequency waves which are propagated in diametrically opposite directions on the facing surface 20 of the electrode plate 2. The radio-frequency waves supplied from the radio-frequency power supply 30 generally have a sinusoidal waveform.

Therefore, the standing waves formed by the radio-frequency waves also have a substantially sinusoidal waveform (except for that when amplitude is zero). For that reason, in accordance with the waveform of the standing waves, a field intensity distribution in radial directions of the object W is caused on the supporting table 12. For example, as shown in FIG. 5B, this field intensity distribution has a shape wherein a field intensity E gradually decreases from the central portion toward the outer peripheral portion in the direction of a radius r of the supporting table 12. For that reason, there is a problem in that the uniformity in the plasma process for the object W in the processing vessel decreases.

SUMMARY OF THE INVENTION

It is therefore an object of the present invention to eliminate the aforementioned problems and to provide a plasma processing system capable of decreasing the variation in field intensity in radial directions of an object to be processed, to more uniformly carry out a plasma process in a processing vessel.

In order to accomplish the aforementioned and other objects, according to the present invention, there is provided a plasma processing system comprising: a processing vessel for housing therein an object to be processed; an electrode provided in the processing vessel; and a radio-frequency wave supply unit for supplying a radio-frequency wave to the electrode, wherein a plasma is produced with the radio-frequency wave in the processing vessel, and the radio-frequency wave supply unit supplies radio-frequency wave having a flattened waveform which forms substantially a sinusoidal wave whose crest and trough portions are substantially horizontally flattened.

According to this plasma processing system, the standing waves formed on the electrode also have a flattened waveform which forms substantially a sinusoidal wave whose crest and trough portions are substantially horizontally flattened (except for that when amplitude is zero). Therefore, the variation in field intensity in radial directions of the object to be processed can be smaller than that when radio-frequency waves having a substantially sinusoidal waveform is used as it is. Therefore, it is possible to more uniformly plasma-process the object to be processed in the processing vessel.

In this plasma processing system, the radio-frequency wave supply unit may include: a radio-frequency wave source for producing a principal radio-frequency wave having a substantially sinusoidal waveform; a waveform shaper for waveform-shaping a part of the principal radio-frequency wave to produce a complementary radio-frequency wave having a waveform which forms only the crest and trough portions of the waveform of the principal radio-frequency wave; a phase adjuster for shifting the phase of the complementary radio-frequency wave, which has been produced by the waveform shaper, by 180 degrees with respect to the phase of the principal radio-frequency wave; and an adder for superposing the complementary radio-frequency wave, which has been phase-shifted by the phase adjuster, on the principal radio-frequency wave.

In this radio-frequency wave supply unit, by the superposition of the complementary radio-frequency wave on the principal radio-frequency wave in the adder, the crest and trough portions of the waveform of the principal radio-frequency wave can be canceled to obtain the radio-frequency wave having the flattened waveform which forms substantially a sinusoidal wave whose crest and trough portions are substantially horizontally flattened.

In the above described plasma processing system, the electrode may comprise a top electrode and a bottom electrode facing the top electrode, the radio-frequency wave having the flattened waveform being supplied to at least one of the top and bottom electrodes.

BRIEF DESCRIPTION OF THE DRAWINGS

The present invention will be understood more fully from the detailed description given herebelow and from the accompanying drawings of the preferred embodiments of the invention. However, the drawings are not intended to imply limitation of the invention to a specific embodiment, but are for explanation and understanding only.

In the drawings.

DESCRIPTION OF THE PREFERRED EMBODIMENTS

Figure 5A:
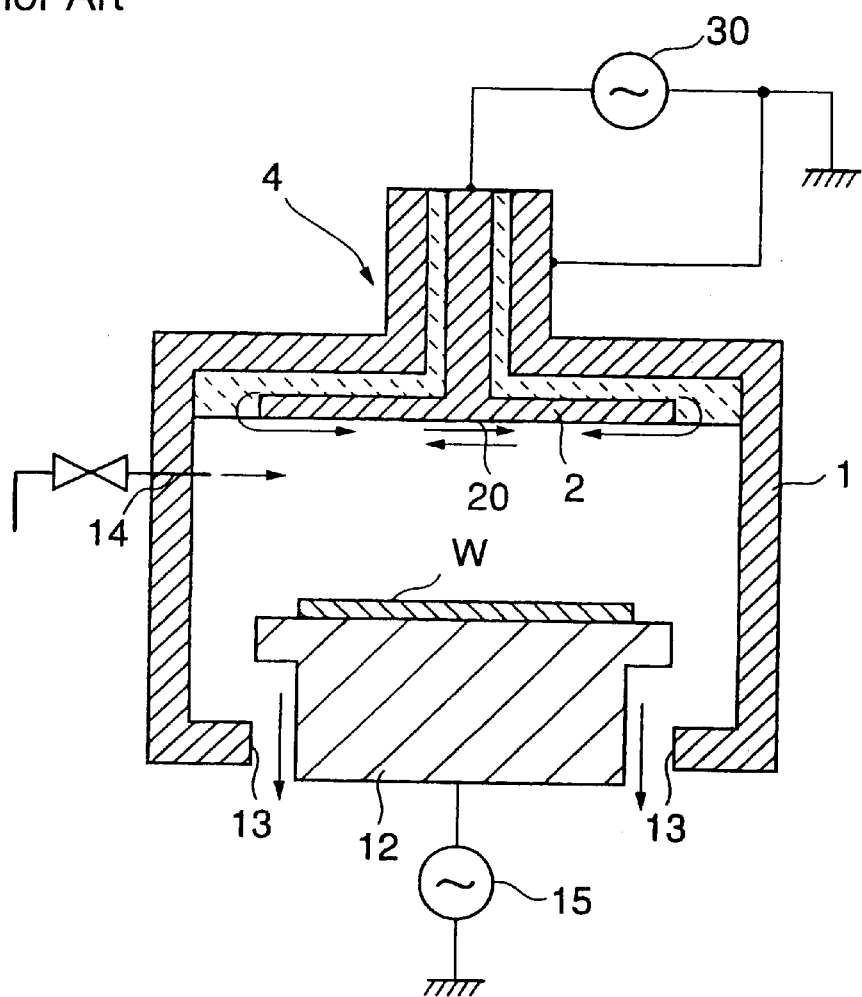
FIG. 5A is a longitudinal section schematically showing a conventional plasma processing system.

Referring now to the accompanying drawings, the preferred embodiment of the present invention will be described below. FIGS. 1A through 3 shows a preferred embodiment of a plasma processing system according to the present invention. In the preferred embodiment of the present invention shown in FIG. 1A, the same reference numbers are given to the same components as those of the conventional example shown in FIG. 5A.

[General Construction]

Figure 1A:
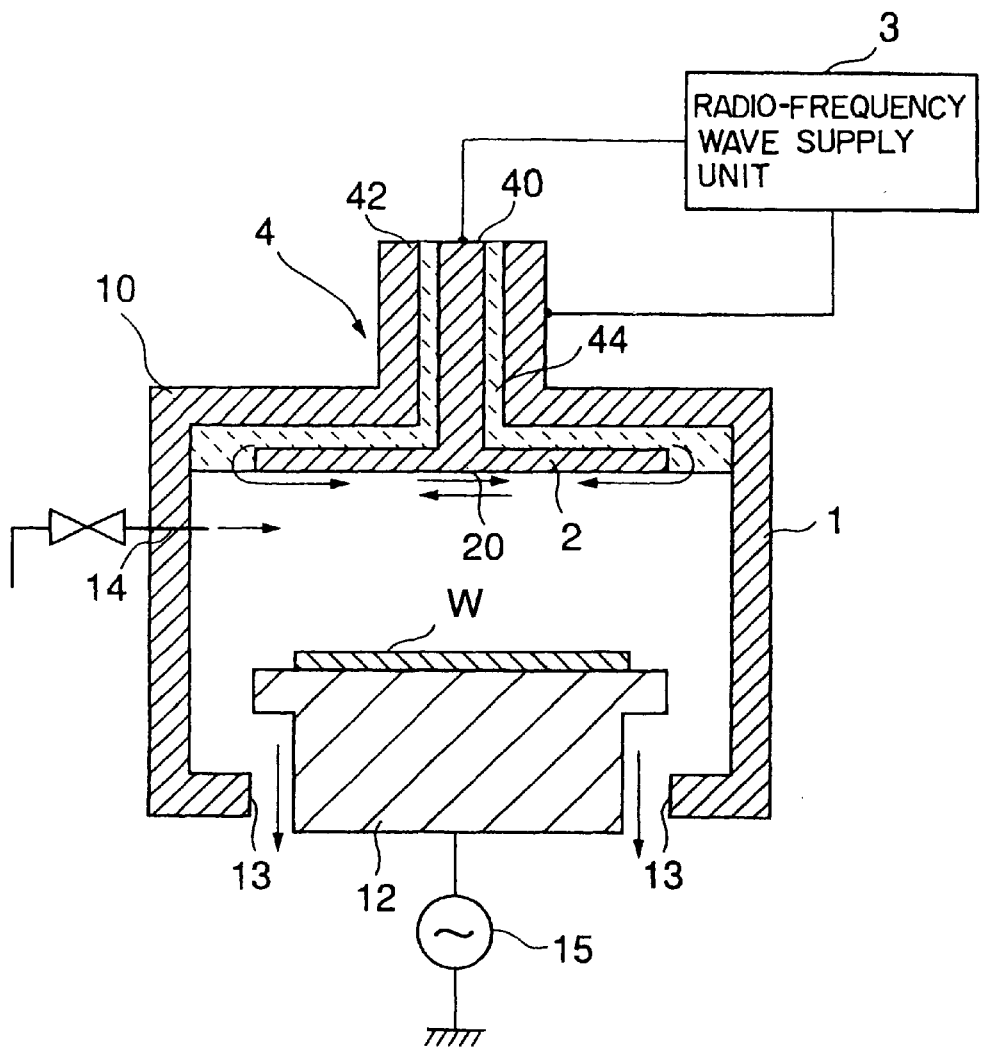
FIG. 1A is a longitudinal section schematically showing a preferred embodiment of a plasma processing system according to the present invention.

First, referring to FIG. 1A, the general construction of a plasma processing system in this preferred embodiment will be described. The plasma processing system shown in FIG. 1A has a metal processing vessel 1 for housing therein an object W to be processed (e.g., a semiconductor wafer or a flat panel display substrate). In the upper portion of the processing vessel 1, a substantially disk-shaped electrode plate (top electrode) 2 having a facing surface 20 facing the object W to be processed is provided.

The plasma processing system also has a radio-frequency wave supply unit 3 for supplying radio-frequency waves to the electrode plate 2. As will be described later, the radio-frequency wave supply unit 3 is designed to supply radio-frequency waves having a flattened waveform which forms substantially a sinusoidal wave whose crest and trough portions are substantially horizontally flattened. The radio-frequency waves supplied from the radio-frequency wave supply unit 3 are propagated in diametrically opposite directions on the facing surface 20 of the electrode plate 2 to form standing waves.

At the center of the top of the processing vessel 1, a feeding channel 4 having a coaxial structure for feeding radio-frequency waves to the electrode plate 2 from the radio-frequency power supply 30 is provided. The feeding channel 4 has a central conductor 40 connected to the central portion of the electrode plate 2, and a cylindrical outer conductor 42 surrounding the central conductor 40. The outer conductor 42 is connected to the top wall 10 of the processing vessel 1. Between the central conductor 40 and the outer conductor 42, a dielectric 44 is provided. The dielectric 44 is also provided between the top face portion 10 of the processing vessel 1 and the electrode 2.

The plasma processing system also has a substantially columnar supporting table (bottom electrode) 12 provided on the bottom of the processing vessel 1. To the supporting table 12, an RF bias power supply 15 for applying a predetermined RF bias power is connected. In the bottom of the processing vessel 1 corresponding to the surrounding of the supporting table 12, an exhaust port 13 for evacuating the atmosphere of the processing vessel 1 is formed. At an appropriate position in the upper portion of the processing vessel 1, an introducing pipe 14 for introducing a process gas or the like is provided.

The plasma processing system is designed to produce a plasma of the process gas by radio-frequency waves, which are applied to the electrode plate 2, in the processing vessel 1 which is held at a predetermined degree of vacuum. Then, the plasma processing system is designed to carry out various plasma processes, such as deposition and etching processes, with respect to the object W on the supporting table 12.

[Construction of Radio-Frequency Wave Supply Unit]

Figure 2:
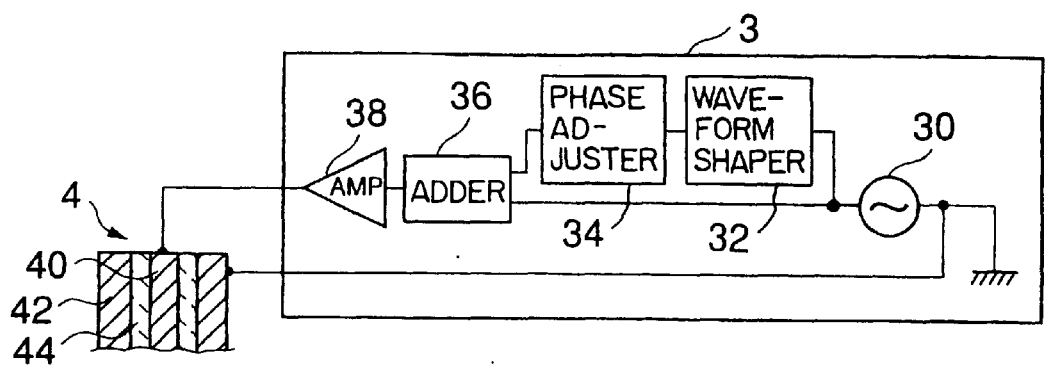
FIG. 2 is a block diagram showing an example of a radio-frequency wave supply unit of the system shown in FIG. 1A.
Figure 3:
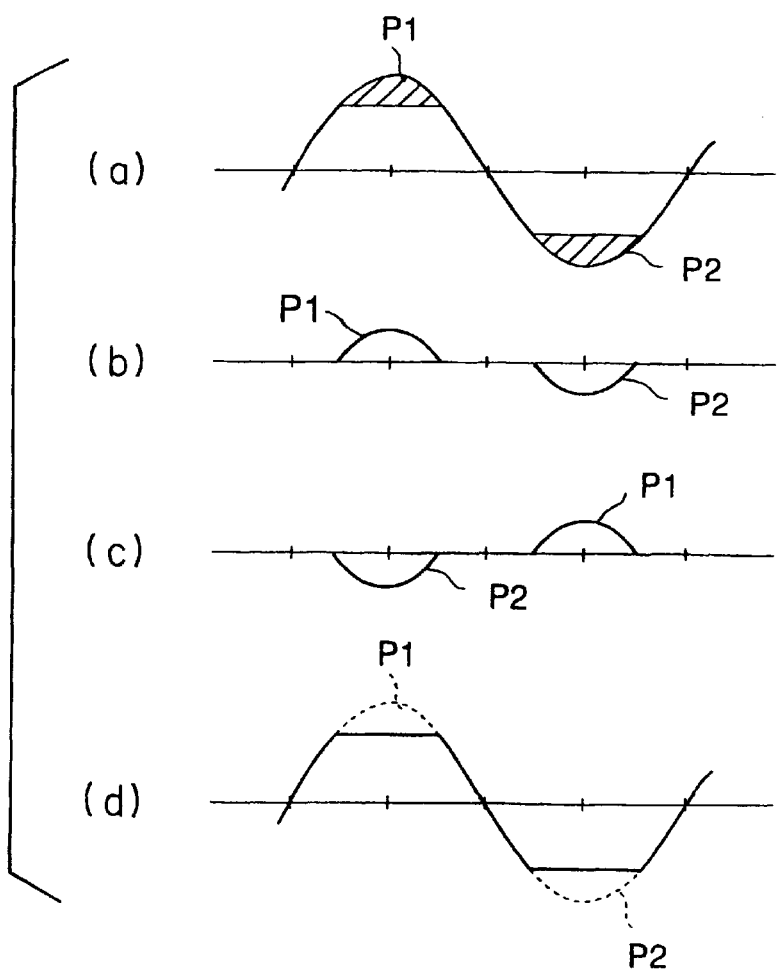
FIG. 3 is a diagram showing an example of waveform of radio-frequency waves in the radio-frequency wave supply unit shown in FIG. 2, wherein (a) shows a principal radio-frequency wave, (b) shows a complementary radio-frequency wave before a phase shift, (c) shows a complementary radio-frequency wave after a phase shift, and (d) shows a resultant radio-frequency wave obtained by superposition.

In FIG. 2, the radio-frequency wave supply unit 3 has a radio-frequency power supply (radio-frequency wave source) 30 for producing principal radio-frequency waves having a substantially sinusoidal waveform (FIG. 3(a)). To the hot-line of the radio-frequency power supply 30, a waveform shaper 32 and an adder 36 are connected in parallel. To the waveform shaper 32, a phase adjuster 34 is connected. The phase adjuster 34 is connected to the adder 36.

The waveform shaper 32 is designed to shape the waveform of a part of the principal radio-frequency waves to produce complementary radio-frequency waves having a waveform which forms only the crest and trough portions P1 and P2 of the waveform of the principal radio-frequency wave. The phase adjuster 34 is designed to shift the phase of the complementary radio-frequency wave, which is produced by the waveform shaper 32, by 180 degrees with respect to the phase of the principal radio-frequency wave (FIG. 3(c)).

The adder 36 is designed to superpose the complementary radio-frequency wave, which has been phase-shifted by the phase adjuster 34, on the principal radio-frequency wave. By the superposition of the complementary radio-frequency wave on the principal radio-frequency wave in the adder 36, the crest and trough portions P1 and P2 (FIG. 3(a)) of the waveform of the principal radio-frequency wave are canceled to obtain a radio-frequency wave (resultant radio-frequency wave) having the flattened waveform which forms substantially a sinusoidal wave whose crest and trough portions P1 and P2 are substantially horizontally flattened as shown in FIG. 3(d).

The adder 36 is connected to an amplifier 38 for amplifying the resultant radio-frequency wave obtained by the superposition. The resultant radio-frequency wave amplified by the amplifier 38 is supplied to the electrode 2 via the feeding channel 4.

[Function and Effect]

With this construction, the function and effect of this preferred embodiment will be described below.

Figure 1B:
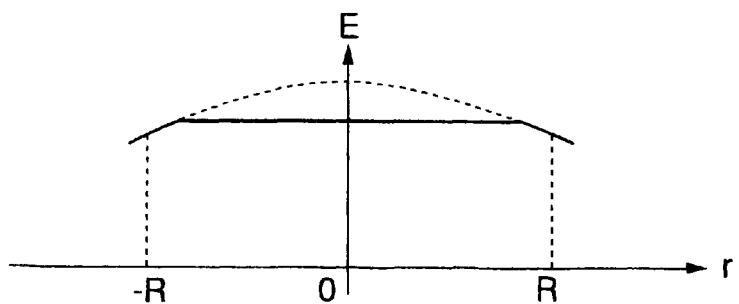
FIG. 1B is a graph showing a radial field intensity distribution on a supporting table of the system shown in FIG. 1A.
Figure 5B:
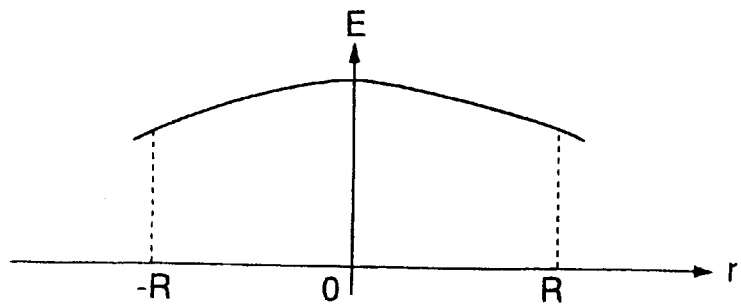
FIG. 5B is a graph showing a radial field intensity distribution on a supporting table of the system shown in FIG. 5A.

According to this preferred embodiment, the waveform of the standing wave formed on the facing surface 20 of the electrode 2 also has a flattened waveform which forms substantially a sinusoidal wave whose crest and trough portions P1 and P2 are substantially horizontally flattened, similar to the waveform of the above described resultant radio-frequency wave (except for that when amplitude is zero). Therefore, as shown in FIG. 1B, the variation in field intensity E in radial direction r of the object to be processed can be smaller than that when the radio-frequency wave having the substantially sinusoidal waveform is used as it is (FIG. 5B). For that reason, it is possible to more uniformly process the object W with the plasma in the processing vessel 1.

[Modified Examples]

In the above described preferred embodiment, the construction of the radio-frequency wave supply unit 3 should not be limited to the above described construction. The radio-frequency wave supply unit may have another construction if it can supply radio-frequency waves having a flattened waveform which forms substantially a sinusoidal wave whose crest and trough portions P1 and P2 are substantially horizontally flattened, similar to the waveform of the above described resultant radio-frequency wave. The structure of the feeding channel 4 should not be limited to the above described coaxial structure. The feeding channel 4 may have another structure if it can feed radio-frequency waves to the electrode 2 from the radio-frequency wave supply unit 3.

While the radio-frequency waves having the flattened waveform have been applied to the top electrode (electrode plate) 2, the present invention should not be limited thereto. That is, the radio-frequency waves having the flattened waveform have been applied to the bottom electrode (supporting table) 12. Alternatively, the radio-frequency waves having the flattened waveform may be applied to both of the top electrode 2 and the bottom electrode 12. In the latter, as the radio-frequency wave supply unit for the top electrode 2 and the bottom electrode 12, a common unit may be used, or specific units may be used for the respective electrodes.

One of the electrode plate (top electrode) 2 and the supporting table (bottom electrode) 12 may be grounded, and radio-frequency waves having the flattened waveform may be applied to the other electrode.

While the horizontal section of each of the top electrode (electrode plate) 2 and the bottom electrode (supporting table) 12 has been circular, the horizontal section may have another shape such as rectangle.

Another Embodiment

Figure 4A:
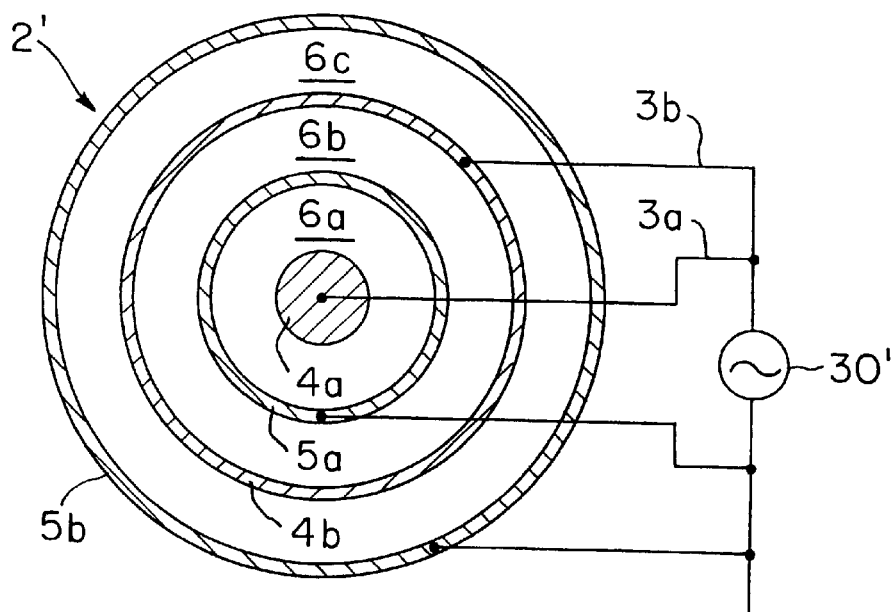
FIG. 4A is a horizontal section of an antenna portion, which schematically shows another embodiment of a plasma processing system according to the present invention.
Figure 4B:
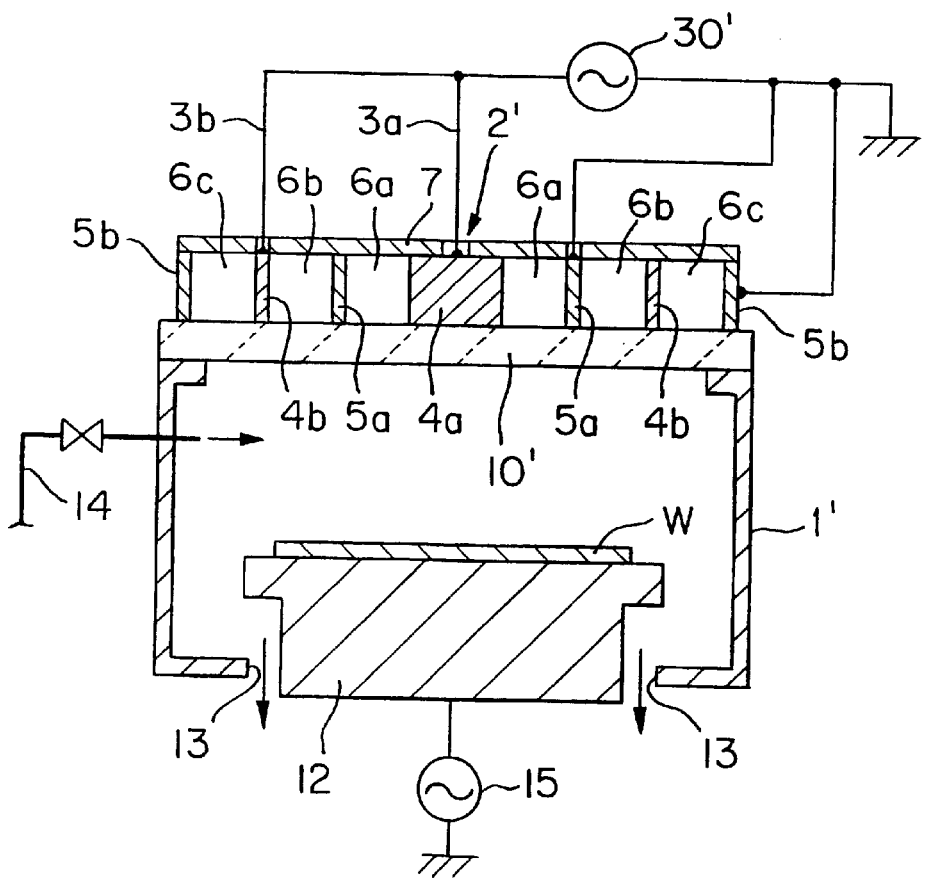
FIG. 4B is a longitudinal section showing the whole construction of the system shown in FIG. 4A.

Another embodiment of the present invention will be described below. FIGS. 4A and 4B show another embodiment of a plasma processing system according to the present invention. In the embodiment shown in FIG. 4B, the same reference numbers are given to the same components as those in the above described preferred embodiment shown in FIG. 1A.

[Construction]

In FIG. 4B, the plasma processing system in this embodiment has a substantially cylindrical metal processing vessel 1'. On the top face of the processing vessel 1', a transmission window 10' of a radio-frequency transmittable dielectric, such as quarts glass, is provided. On the top of the transmission window 10' of the processing vessel 1', a radio-frequency antenna 2' is mounted.

As shown in FIGS. 4A and 4B, the plasma processing system has a radio-frequency power supply 30' for supplying radio-frequency waves to the antenna 2'. The radio-frequency power supply 30' is designed to supply radio-frequency waves having a UHF band of, e.g., 500 MHz.

The antenna 2' has a columnar central antenna element 4a, and three annular (cylindrical in this case) outer antenna elements 5a, 4b and 5b which are concentrically arranged so as to surround the central antenna element 4a. The antenna 2' is designed to form field generating regions 6a, 6b and 6c due to radio-frequency waves between the facing antenna elements 4a and 5a, between the facing antenna elements 5a and 4b and between the facing antenna elements 4b and 5b, respectively.

Specifically, the first and third (odd number-th) antenna elements 4a and 4b from the inside of the antenna 2' are connected to the hot-lines 3a and 3b from the radio-frequency power supply 30', respectively, and the second and forth (even number-th) antenna elements 5a and 5b from the inside of the antenna 2' are grounded, respectively. In this case, the difference between the lengths of the hot-lines 3a and 3b is set to be an integer times as large as the half-wave length of the radio-frequency wave, taking account of the half of the length of the antenna portion. However, the length of each of the hot-lines 3a and 3b may be a free length if the power supply and frequency of the radio-frequency wave are different for each of the hot-lines 3a and 3b.

The top face of the antenna 2' is covered with a conductive shielding plate 7 (FIG. 4B). The shielding plate 7 is not designed to electrically contact each of the antenna elements 4a, 5a, 4b and 5b.

As shown in FIG. 4B, the plasma processing system has a supporting table 12 provided on the bottom of the processing vessel 1'. In the bottom of the processing vessel 1' corresponding to the surrounding of the supporting table 12, an exhaust port 13 for evacuating the atmosphere of the processing vessel 1' is formed. At an appropriate position in the upper portion of the processing vessel 1', an introducing pipe 14 for introducing a process gas or the like is provided. To the supporting table 12, an RF bias power supply 15 for applying an RF bias power of, e.g., 0.8 to 2 MHz, is connected.

The plasma processing system is designed to produce the plasma of the process gas by radio-frequency waves, which are introduced from the antenna 2', in the processing vessel 1' which is held at a predetermined degree of vacuum. Then, the plasma processing system is designed to carry out various plasma processes, such as deposition and etching processes, with respect to an object W to be processed (e.g., a semiconductor wafer) on the supporting table 12.

[Function and Effect]

With this construction, the function and effect of this embodiment will be described below.

According to this embodiment, the field generating regions 6a, 6b and 6c between the facing antenna elements 4a and 5a of the antenna 2', between the facing antenna elements 5a and 4b of the antenna 2' and between the facing antenna elements 4b and 5b of the antenna 2' are also annular. Then, if the distances between the antenna elements 4a and 5a, between the antenna elements 5a and 4b and between the antenna elements 4b and 5b are suitably set, the field intensity in each of the field generating regions 6a, 6b and 6c can be uniform in radial directions (it is naturally uniform in peripheral directions).

Therefore, the radial distribution of radio-frequency waves introduced from the antenna 2' into the processing vessel 1 can be uniform, so that it is possible to more uniformly process the object W with the plasma in the processing vessel 1'.

[Modified Examples]

In the antenna 2' in this embodiment, while the even number-th antenna elements 5a and 5b from the inside have been grounded, the odd number-th antenna elements 4a and 4b from the inside may be grounded, respectively.

While only one radio-frequency power supply 30' has been provided in this embodiment, the present invention should not be limited thereto. That is, the field of each of the field generating regions 6a, 6b and 6c of the antenna 2' may be adjustable by providing a plurality of radio-frequency power supplies so that the powers or frequencies of radio-frequency waves supplied from the respective radio-frequency power supplies are different.

In such a case, by adjusting the field of each of the field generating regions 6a, 6b and 6c of the antenna 2' by means of the respective radio-frequency power supplies, the radial field intensity in each of the field generating regions 6a, 6b and 6c can be uniform regardless of the distances between the antenna elements 4a and 5a, between the antenna elements 5a and 4b and between the antenna elements 4b and 5b.

In the antenna 2' in this embodiment, while three outer antenna elements 5a, 4b and 5b have been concentrically arranged around the central antenna element 4a, two or four or more outer antenna elements may be concentrically arranged around the central antenna element 4a in accordance with the size of the processing vessel 1'.

The periphery of the antenna 2' may be surrounded by an annular conductive shielding plate (or an extending portion of the processing vessel). In such a case, the shielding plate can be used as the outermost (ground side) antenna element.

While the present invention has been disclosed in terms of the embodiment in order to facilitate better understanding thereof, it should be appreciated that the invention can be embodied in various ways without departing from the principle of the invention. Therefore, the invention should be understood to include all possible embodiments and modification to the shown embodiments which can be embodied without departing from the principle of the invention as set forth in the appended claims.

What is claimed is:

1. A plasma processing system comprising:

a processing vessel for housing therein an object to be processed;

an electrode provided in said processing vessel; and a radio-frequency wave supply unit for supplying a radio-frequency wave to said electrode, wherein a plasma is produced with said radio-frequency wave in said processing vessel, and said radio-frequency wave supplied by said radio-frequency wave supply unit has a flattened waveform which forms substantially a sinusoidal wave whose crest and trough portions are substantially horizontally flattened.

2. A plasma processing system as set forth in claim 1, wherein said radio-frequency wave supply unit comprises:

a radio-frequency wave source for producing a principal radio-frequency wave having a substantially sinusoidal waveform;

a waveform shaper for waveform-shaping a part of said principal radio-frequency wave to produce a complementary radio-frequency wave having a waveform which forms only said crest and trough portions of said waveform of said principal radio-frequency wave;

a phase adjuster for shifting the phase of said complementary radio-frequency wave, which has been produced by said waveform shaper, by 180 degrees with respect to the phase of said principal radio-frequency wave; and an adder for superposing said complementary radio-frequency wave, which has been phase-shifted by said phase adjuster, on said principal radio-frequency wave.

3. A plasma processing system as set forth in claim 1, wherein said electrode comprises a top electrode and a bottom electrode facing the top electrode, said radio-frequency wave having the flattened waveform being supplied to at least one of said top and bottom electrodes.

4. A plasma processing system as set forth in claim 2, wherein said electrode comprises a top electrode and a bottom electrode facing the top electrode, said radio-frequency wave having the flattened waveform being supplied to at least one of said top and bottom electrodes.

* * * * *